United States Patent
Kim et al.

(10) Patent No.: US 8,003,729 B2
(45) Date of Patent: Aug. 23, 2011

(54) ORGANIC INSULATOR COMPOSITION INCLUDING A HYDROXYL GROUP-CONTAINING POLYMER, DIELECTRIC FILM AND ORGANIC THIN FILM TRANSISTOR USING THE SAME

(75) Inventors: Joo Young Kim, Suwon-si (KR); Myung Sup Jung, Seongnam-si (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 331 days.

(21) Appl. No.: 12/081,452

(22) Filed: Apr. 16, 2008

(65) Prior Publication Data

US 2008/0283829 A1    Nov. 20, 2008

(30) Foreign Application Priority Data

May 19, 2007  (KR) .................. 10-2007-0048930

(51) Int. Cl.
*C08G 63/48* (2006.01)
(52) U.S. Cl. .................... 525/10; 257/40; 257/E51.001
(58) Field of Classification Search .............. 257/40; 525/10
See application file for complete search history.

(56) References Cited

U.S. PATENT DOCUMENTS

2005/0279995 A1   12/2005  Shin et al.
2008/0067505 A1*  3/2008  Lee et al. ................... 257/40
2009/0092814 A1*  4/2009  Kunitake et al. .......... 428/220

FOREIGN PATENT DOCUMENTS

WO    WO 01/33649 A1    5/2001

OTHER PUBLICATIONS

Yamaoka et al, "Novel Polymeric Resists Based on Vinyl Ether Functionality," Journal of Photopolymer Science and Technology, vol. 9, No. 4 (1996), pp. 723-728.*
Lee et al, "Hysteresis mechanism and reduction method in the bottom-contact pentacene thin-film transistors with cross-linked poly-(vinyl alcohol) gate insulator," Applied Physics Letters, 88, 252102 (2006).*
European Office Action dated Sep. 3, 2010 in corresponding European Application No. 08155916.3.

* cited by examiner

*Primary Examiner* — Eugene Lee
*Assistant Examiner* — Anthony Ho
(74) *Attorney, Agent, or Firm* — Harness, Dickey & Pierce, P.L.C.

(57) ABSTRACT

An organic insulator composition including a crosslinking agent and a hydroxyl group-containing oligomer or hydroxyl group-containing polymer is provided. A dielectric film and an organic thin film transistor (OFTF) using an organic insulator composition are also provided. A dielectric film may include a compound having hydroxyl group-containing oligomers or hydroxyl group-containing polymers linked by crosslinking using a crosslinking agent having at least two vinyl ether groups. An organic thin film transistor may include a gate electrode on a substrate, a gate insulating layer on the gate electrode, source and drain electrodes on the gate insulating layer and an organic semiconductor layer contacting the gate insulating layer, wherein the gate insulating layer includes an dielectric film as described above.

13 Claims, 2 Drawing Sheets

ORGANIC INSULATOR COMPOSITION INCLUDING A HYDROXYL GROUP-CONTAINING POLYMER, DIELECTRIC FILM AND ORGANIC THIN FILM TRANSISTOR USING THE SAME

PRIORITY STATEMENT

This non-provisional application claims the benefit of priority under U.S.C. §119 from Korean Patent Application No. 10-2007-0048930, filed on May 19, 2007 with the Korean Intellectual Property Office (KIPO), the entire contents of which are herein incorporated by reference.

BACKGROUND

1. Field

Example embodiments relate to an organic insulator composition including a hydroxyl group-containing polymer and a dielectric film and an organic thin film transistor (OTFT) using the same. Other example embodiments relate to an organic insulator composition, which includes a crosslinking agent and a hydroxyl group-containing oligomer or hydroxyl group-containing polymer, that may be used to form a thin film using a low-temperature wet process.

2. Description of the Related Art

In general, a thin film transistor (TFT) is used as a switching device for a flat panel display example (e.g., a liquid crystal display, an organic electroluminescent display, an electrophoretic display or the like). A semiconductor layer of the TFT is generally formed of an inorganic semiconductor material (e.g., silicon (Si)).

According to the recent trend toward the fabrication of large, inexpensive and flexible displays, research is being conducted on organic semiconductor materials that may replace expensive inorganic materials that require a high-temperature vacuum process. Because an organic thin film transistor (OTFT) may be fabricated using a solution process at low temperatures, it may be easier to apply the OTFT to large-area flat panel displays, which are fabricated using only a deposition process. The OTFT may be prepared in the form of a fiber or a film due to the properties of the organic material. As such, an OTFT may be used in a flexible display device.

The flexible display device may be formed on a thin and flexible substrate (e.g., paper). The flexible display device may have increased flexibility (including bendability and windability) and/or a higher resistance to damage and impact.

During the fabrication of a flexible display device, an organic insulator may be formed into a thin film on a plastic substrate and cured by performing a curing process (e.g., thermal curing).

Thermal curing may be performed at a substantially high temperature of 150° C. and above. Because of the substantially high temperature, thermal deformation of the plastic substrate may occur during the insulator curing process, leading to misalignment. As such, electrical properties of the device may deteriorate.

Research on novel organic gate insulating films, which may be subjected to a low-temperature process to decrease negative influences on the substrate or other process films, is being conducted. Although the organic insulating film (e.g., polyimide, polyvinylalcohol, poly(vinylphenol-maleimide), or photoacryl) is used, it may not increase the properties of the device to the extent that it can be considered a comparable alternative to conventional inorganic insulating films.

In order to form OTFTs having higher efficiency, alternative materials for the insulating film that exhibit heat and/or chemical resistance are being researched, enabling the formation of a thin film through a wet process at a temperature lower than 130° C. Alternative materials for the insulating film that increase electrical properties (including charge mobility, threshold voltage, and on/off current ratio) of a device when used in an OTFT are also being researched.

SUMMARY

Example embodiments relate to an organic insulator composition including a hydroxyl group-containing polymer and a dielectric film and an organic thin film transistor (OTFT) using the same. Other example embodiments relate to an organic insulator composition, which includes a crosslinking agent and a hydroxyl group-containing oligomer or hydroxyl group-containing polymer, that may be used to form a thin film using a low-temperature wet process.

Example embodiments also provide an organic insulator composition, which may be formed into a thin film using a wet process at temperatures lower than 130° C. Other example embodiments provide an organic insulator composition that may impart desired electrical properties upon the fabrication of an OTFT.

Example embodiments also provide a dielectric film, which may be prepared using a low-temperature wet process, and an OTFT, which includes the dielectric film, providing higher charge mobility and/or lower threshold voltage.

According to example embodiments, the organic insulator composition may include a hydroxyl group-containing oligomer or hydroxyl group-containing polymer. The organic insulator composition may also include a crosslinking agent.

The hydroxyl group-containing oligomer or hydroxyl group-containing polymer may be selected from the group consisting of polyvinylalcohol, polyvinylphenol, poly(hydroxyphenylmaleimide co hydroxystyrene), polyhydroxyimide, poly(vinylalcohol-co-ethylene) and copolymers thereof. The hydroxyl group-containing oligomer or hydroxyl group-containing polymer may be selected from the group consisting of oligomer or polymers represented by Formulas (1) to (3) below:

FORMULA (1)

wherein X and Y are each independently a tetravalent aromatic or aliphatic organic group, Z is hydrogen or a crosslinkable monovalent organic group, and n is an integer from 10 to 1,000;

FORMULA (2)

wherein Z and Z' are each independently hydrogen, a hydroxyl group, or a phenol group, and n is an integer from 10 to 1,000; and

FORMULA (3)

wherein l, m, and n are each independently an integer from 0 to 1,000, in which l and m are not both 0.

According to example embodiments, a dielectric film, which includes a compound in which hydroxyl group-containing oligomers or hydroxyl group-containing polymers are connected via crosslinking using a crosslinking agent having two or more vinyl ether groups, is provided.

For example, the dielectric film may include the compound represented by Formula (11) below:

FORMULA (11)

wherein X and Y are each independently a tetravalent aromatic or aliphatic organic group, and B is a divalent aromatic or aliphatic organic group.

Example embodiments provide an OTFT including a gate electrode formed on a substrate; a gate insulating layer formed on the gate electrode; source and drain electrodes formed on the gate insulating layer; and an organic semiconductor layer contacting the gate insulating layer, wherein the gate insulating layer may be the dielectric film according to example embodiments.

BRIEF DESCRIPTION OF THE DRAWINGS

Example embodiments will be more clearly understood from the following detailed description taken in conjunction with the accompanying drawings. FIGS. 1-2 represent non-limiting, example embodiments as described herein.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to an organic insulator composition including a hydroxyl group-containing polymer and a dielectric film and an organic thin film transistor (OTFT) using the same. Other example embodiments relate to an organic insulator composition, which includes a crosslinking agent and a hydroxyl group-containing oligomer or hydroxyl group-containing polymer, that may be used to form a thin film using a low-temperature wet process.

In the present application, the term "hydroxyl group-containing oligomer or hydroxyl group-containing polymer" means an oligomer or polymer that contains a hydroxyl group in the main chain or side chain of the oligomer or polymer. Examples of the hydroxyl group-containing oligomer or hydroxyl group-containing polymer include an oligomer or polymer containing a vinyl alcohol or a vinyl phenyl moiety in the main chain or side chain thereof.

The organic insulator composition is characterized in that a hydroxyl group-containing oligomer or hydroxyl group-containing polymer, functioning as a base resin, is mixed with a crosslinking agent having two or more vinyl ether groups. The mixture may be formed into a thin film using a wet process (e.g., spin coating, roll coating, or printing) at temperatures lower than 130° C.

The hydroxyl group-containing oligomer or hydroxyl group-containing polymer of the organic insulator composition may be selected from the group consisting of polyvinylalcohol, polyvinylphenol, poly(hydroxyphenyl maleimide-co-hydroxystyrene), polyhydroxyimide, poly(vinyl alcohol-co-ethylene) and copolymers thereof. The hydroxyl group-containing oligomer or hydroxyl group-containing polymer may be selected from the group consisting of oligomers or polymers represented by Formula (1) to (3) below:

FORMULA (1)

wherein X and Y are each independently a tetravalent aromatic or aliphatic organic group, Z is hydrogen or a crosslinkable monovalent organic group, and n is an integer from 10 to 1,000;

FORMULA (2)

wherein Z and Z' are each independently hydrogen, a hydroxyl group, or a phenol group, and n is an integer from 10 to 1,000; and

FORMULA (3)

wherein l, m, and n are each independently an integer from 0 to 1,000, in which l and m are not both 0.

In Formula (1), X may be selected from the group consisting of

In Formula (1), Y may be selected from the group consisting of

In Formula (1), Z may be selected from the group consisting of hydrogen (H),

Examples of the hydroxyl group-containing oligomer or hydroxyl group-containing polymer include, but are not limited to, oligomers or polymers represented by Formulas (4) to (10) below:

FORMULA (4)

FORMULA (5)

FORMULA (6)

FORMULA (8)

FORMULA (7)

FORMULA (9)

$$-\!\!-\!\!\underset{OH}{\overset{|}{\underset{|}{T}}}\!\!\Big]_{n}\!\!-\!\!,$$

wherein, in Formulas (4) to (9), n is an integer from 10 to 1,000; and

FORMULA (10)

wherein x and y are each independently an integer from 10 to 1,000.

In the organic insulator composition according to example embodiments, the crosslinking agent may be a compound having two or more vinyl ether groups. Crosslinking agents well-known in the art may be used so long as the crosslinking agent achieves the purpose of set forth by example embodiments. Examples of the crosslinking agent include, but are not limited to, 2,2'-bis(4-(2-(vinyloxy)ethoxy)phenyl)propane (BPA-DEVE), 1,1,1-tris(4-(2-(vinyloxy)ethoxy]phenyl) ethane, 1,3,5-tris(2-(vinyloxy)ethoxy)benzene, poly(ethylene glycol)divinyl ether, 4,4'-bis-but-3-enyloxy-biphenyl, and 1,5-bis-but-3-enyloxy-naphthalene.

In the organic insulator composition according to example embodiments, an amount of the hydroxyl group-containing oligomer or hydroxyl group-containing polymer varies depending on the application in which the oligomer or polymer is used. For example, the hydroxyl group-containing oligomer or hydroxyl group-containing polymer may be used in an amount ranging from about 5 wt % to about 60 wt %. If the amount of the hydroxyl group-containing oligomer or hydroxyl group-containing polymer exceeds 60 wt %, the viscosity of the composition may be too high, making it difficult to completely dissolve the hydroxyl group-containing oligomer or hydroxyl group-containing polymer and/or to remove impurities by filtration. If the amount of the hydroxyl group-containing oligomer or hydroxyl group-containing polymer is less than 5 wt %, it may be difficult to subsequently form a film through deposition processes (e.g., spin coating) due to the substantially low concentration of the oligomer or polymer. If the amount of the hydroxyl group-containing oligomer or hydroxyl group-containing polymer is less than 5 wt %, flatness may decrease.

In the organic insulator composition according to example embodiments, an amount of the crosslinking agent varies depending on the amount of the hydroxyl group-containing oligomer or hydroxyl group-containing polymer. The amount of the crosslinking agent may be in a range between the lower limit of Equation 1 (below) and the upper limit of Equation 2 (below), based on the weight of the hydroxyl group-containing oligomer or hydroxyl group-containing polymer (or the base resin).

If the amount of the crosslinking agent exceeds the upper limit, the electrical properties of the device fabricated using the composition may deteriorate due to the presence of any unreacted crosslinking agent. If the amount is less than the lower limit, the degree of curing of the hydroxyl group-containing oligomer or hydroxyl group-containing polymer may decrease, causing a variety of problems.

$$\left( \frac{M.W. \text{ of crosslinking agent}}{M.W. \text{ of repeating unit of base resin}} \times \frac{\text{number of } OH \text{ groups in repeating unit of base resin}}{\text{number of } vinylether \text{ groups in crosslinking agent}} \right) \qquad \text{EQUATION (1)}$$

$$100 \times 0.1 \text{ parts}$$

$$\left( \frac{\text{M.W. of crosslinking agent}}{\text{M.W. of repeating unit of base resin}} \times \frac{\text{number of } OH \text{ groups in repeating unit of base resin}}{\text{number of } \textit{vinylether} \text{ groups in crosslinking agent}} \right) \times 120 \text{ parts} \qquad \text{EQUATION (2)}$$

According to example embodiments, the organic insulator composition according to example embodiments may be applied (or formed) on a substrate, dried, and cured to obtain a dielectric film. The dielectric film may be used as an organic insulating layer of an OTFT. However, use of the dielectric film is not particularly limited.

In the organic insulator composition according to example embodiments, the hydroxyl group of the hydroxyl group-containing oligomer or hydroxyl group-containing polymer, functioning as the base resin, may be subjected to acetalation with the vinyl ether groups of the crosslinking agent such that the hydroxyl group-containing oligomers or hydroxyl group-containing polymers may be linked (or connected) to each other by the crosslinking agent. As such, the organic insulator composition may be cured at temperatures lower than 130° C.

Reaction 1 (below) illustrates the acetalation mechanism between the hydroxyl group of polyhydroxyimide (1) of Formula (4) and the vinyl ether group of the crosslinking agent, 2,2'-bis(4-(2-(vinyloxy)ethoxy)phenyl)propane (2).

The organic insulator composition (3) may be applied to flexible display devices.

The dielectric film according to example embodiments is characterized by the inclusion of a compound in which hydroxyl group-containing oligomers or hydroxyl group-containing polymers are connected via crosslinking using a crosslinking agent having two or more vinyl ether groups. Examples of the compound, in which the hydroxyl group-containing oligomers or hydroxyl group-containing polymers are connected to each other by the crosslinking agent, include a compound of Formula (11) below:

FORMULA (11)

wherein X and Y are each independently a tetravalent aromatic or aliphatic organic group, and B is a divalent aromatic or aliphatic organic group.

In Formula (11), X is selected from the group consisting of

In Formula (11), Y is selected from the group consisting of

Example embodiments also provide an OTFT including the dielectric film as described above. The OTFT may include a substrate, a gate electrode, a gate insulating layer, source/drain electrodes, and an organic semiconductor layer. However, the layer structure of the OTFT is not limited thereto.

Figure 1A:
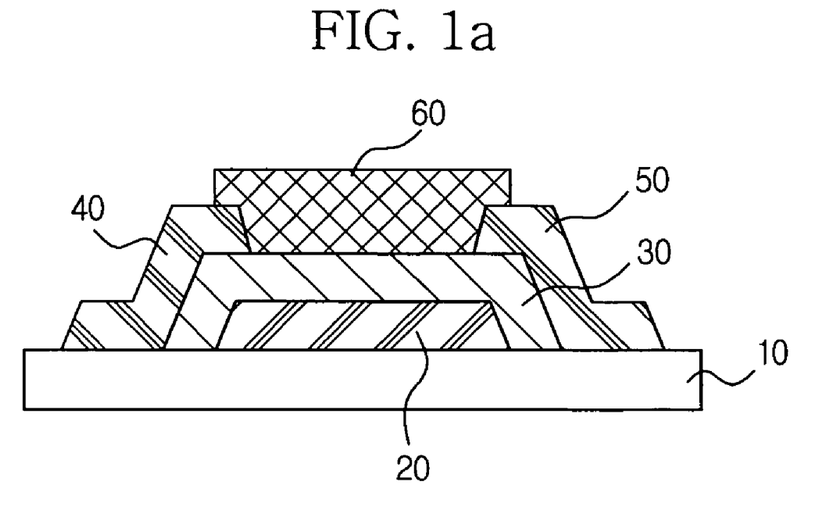
FIG. 1A is a diagram illustrating a schematic cross-sectional view of the bottom contact type OTFT according to example embodiments.

FIG. 1A is a diagram illustrating a schematic cross-sectional view of a bottom contact type OTFT according to example embodiments.

Referring to FIG. 1A, the OTFT may have a bottom contact (BC) structure including a substrate 10, a gate electrode 20, a gate insulating layer 30, a source electrode 40, a drain electrode 50 and/or an organic semiconductor layer 60. The substrate 10, a gate electrode 20, a gate insulating layer 30, a source electrode 40, a drain electrode 50 and an organic semiconductor layer 60 may be sequentially laminated such that the organic semiconductor layer 60 is formed on the source electrode 40 and the drain electrode 50.

Figure 1B:
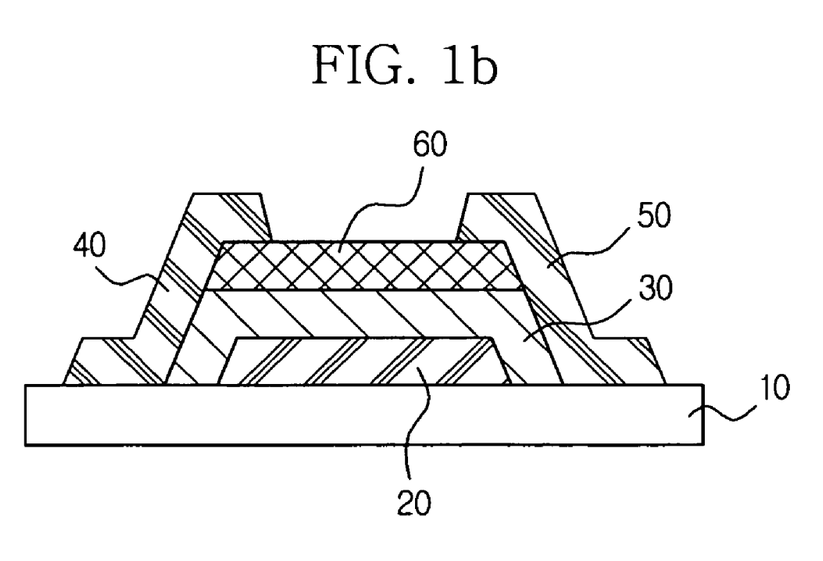
FIG. 1B is diagram illustrating a schematic cross-sectional view of the top contact type OTFT according to example embodiments.

FIG. 1B is diagram illustrating a schematic cross-sectional view of a top contact type OTFT according to example embodiments.

Referring to FIG. 1B, the OTFT may be formed (or realized) in a top contact (TC) structure, in which a metal electrode (not shown) is subsequently formed on the organic semiconductor layer 60 through a deposition process (e.g., mask deposition). The OTFT is not limited to these structures. For example, the OTFT may have a top gate structure or a bottom gate structure.

In the OTFT, the gate insulating layer may be formed using the organic insulator composition including the hydroxyl group-containing oligomer or hydroxyl group-containing polymer and the crosslinking agent in order to increase the electrical properties of the device and/or to facilitate the process for forming the thin film of the insulating layer.

The insulating layer of the OTFT according to example embodiments may be prepared using the organic insulator composition disclosed herein. The insulating layer of the OTFT may include an organic insulator containing polyimide, benzocyclobutene, parylene, polyacrylate, polyvinylbutyral and/or polyvinylphenol. The insulating layer of the OTFT may be formed into a thin film through screen printing, printing, dipping, ink jetting or laser deposition, spin coating or other like methods.

The insulating layer of the OTFT may be provided in the form of a thin film using a wet process (e.g., printing coating, spin coating, bar coating, etc.) under normal pressure opposed to a conventional plasma-enhanced chemical vapor deposition process for forming a silicon (Si) thin film. The insulating layer of the OTFT may be subjected to a roll-to-roll process using a plastic substrate to realize (or form) a lower costing TFT.

The OTFT according to example embodiments may be applied to (or used in) driving elements for driving plastic-based active organic electroluminescent devices, smart cards or plastic chips for inventory tags.

The organic semiconductor layer may be formed of materials well-known in the art. Examples of materials used to form the organic semiconductor layer may include, but are not limited to, pentacene, copper phthalocyanine, polythiophene, polyaniline, polyacetylene, polypyrrole, polyphenylenevinylene and derivatives thereof.

Examples of materials used for the substrate include, but are not limited to, glass, polyethylene naphthalate (PEN), polyethylene terephthalate (PET), polycarbonate, polyvinylbutyral, polyacrylate, polyimide, polynorbornene, polyethersulfone (PES) or the like.

The gate electrode and the source/drain electrodes may be formed of metals well-known in the art. Examples of metals that may be used for the gate electrode and the source/drain electrodes include, but are not limited to, gold (Au), silver (Ag), aluminum (Al), nickel (Ni), indium tin oxide (ITO), molybdenum (Mo), tungsten (W) or similar metals.

A further understanding of the example embodiments may be obtained in view of the following examples, which are set forth to illustrate but are not to be construed to limit the example embodiments.

Example 1

10 g of a polyhydroxyimide solution was prepared by dissolving 1 g of a polyhydroxyimide polymer (n=100) of Formula (4) to a concentration of 10 wt % in a cyclohexanone solvent. The resulting polyhydroxyimide solution was mixed with 0.288 g of 2,2'-bis(4-(2-(vinyloxy)ethoxy)phenyl)propane (crosslinking agent). The resulting mixture was filtered using a 0.45 μm filter to obtain an organic insulator composition.

On a washed glass substrate, molybdenum for a gate electrode was deposited with a thickness of 1000 Å by sputtering. The insulator composition (described above) was applied thereon through spin coating at 1500 rpm for 50 sec and thermally treated at 130° C. for 5 min to form a film having a thickness of 600 nm. A 1 wt % polythiophene solution in chlorobenzene was applied on the 600 nm film by spin coating at 1000 rpm for 30 sec and thermally treated at 100° C. for 10 min to form a film having a thickness of 500 Å. Gold (Au) for source/drain electrodes was deposited to a thickness of 70 nm on the 500 Å film by sputtering, fabricating an OTFT.

Example 2

10 g of a polyhydroxyimide solution was prepared by dissolving 1 g of a polyhydroxyimide polymer (n=100) of Formula 4 to a concentration of 10 wt % in a cyclohexanone solvent. The resulting polyhydroxyimide solution was mixed with 0.575 g of 2,2'-bis(4-(2-(vinyloxy)ethoxy)phenyl)propane (crosslinking agent). The mixture was filtered using a 0.45 μm filter to obtain an organic insulator composition.

The organic insulator composition was used to obtain an OTFT in the same manner as in Example 1.

Comparative Example 1

An OTFT was fabricated in the same manner as in Example 1 except that a gate insulating layer was formed using only the polyhydroxyimide polymer (n=100) of Formula 4.

Test Example

Evaluation of Electrical Properties of OTFT

Figure 2:
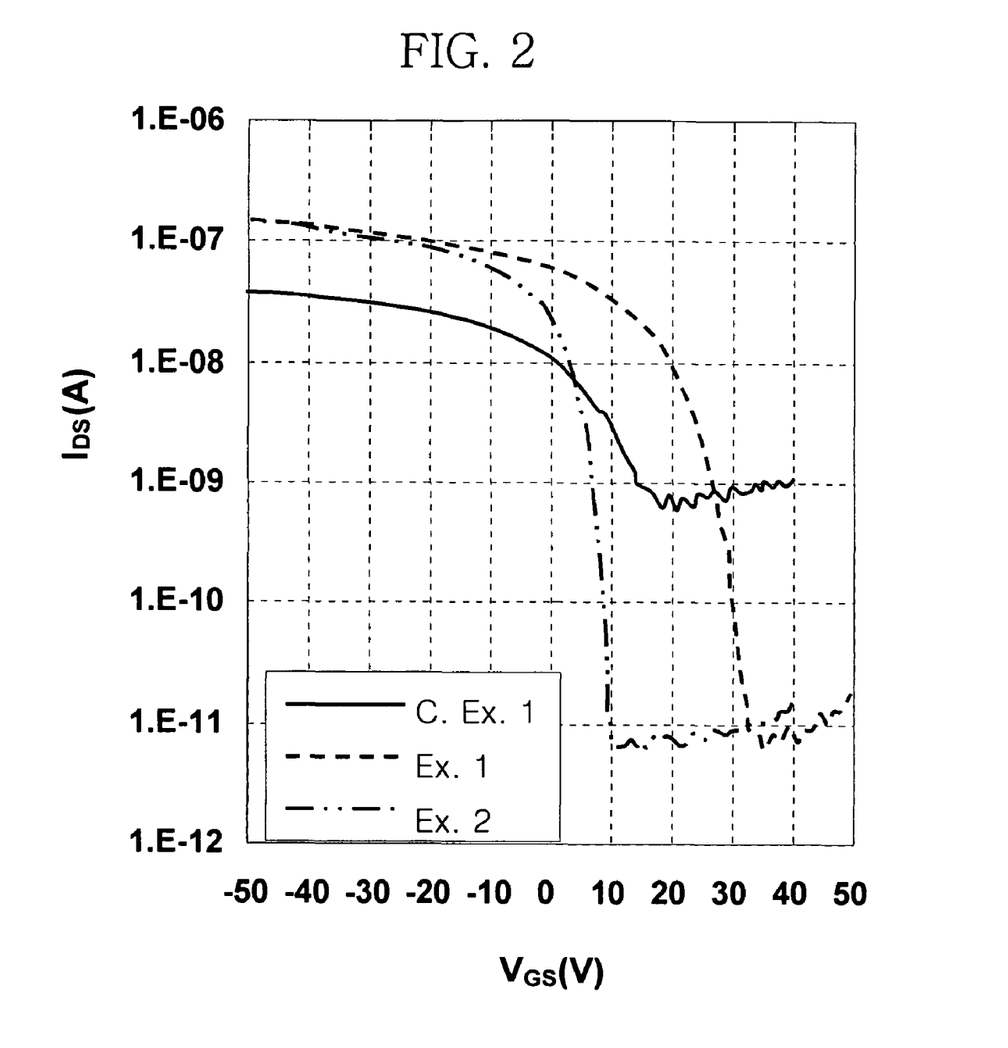
FIG. 2 is a graph illustrating current transfer properties of OTFTs fabricated in according to Examples 1 and 2 and Comparative Example 1 (discussed below).

FIG. 2 is a graph illustrating current transfer properties of OTFTs fabricated in according to Examples 1 and 2 and Comparative Example 1.

Referring to FIG. 2, the current transfer properties of the OTFTs were measured using a semiconductor characterization system (4200-SCS) available from Keithley. The measured values are shown in Table 1 below.

The charge mobility was calculated according to EQUATIONS 3A-3D for the linear region using the current transfer curve shown in FIG. 2. That is, the current equation for the linear region was converted into a graph of $(I_{SD})^{1/2}$ and $V_G$, and the charge mobility was calculated from the slope of the graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

EQUATIONS 3A-3D wherein $I_{SD}$ is the source drain current, $\mu$ or $\mu_{FET}$ is the charge mobility, $C_o$ is the dielectric film capacitance, W is the channel width, L is the channel length, $V_G$ is the gate voltage and $V_T$ is the threshold voltage.

The on/off current ratio ($I_{on}/I_{off}$) was taken from the ratio of maximum current in the on-state to minimum current in the off-state. The $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$ is the maximum current, $I_{off}$ is the off-state leakage current, $\mu$ is the charge mobility, $\sigma$ is the conductivity of the thin film, q is the quantity of electric charge, $N_A$ is the density of electric charge, t is the thickness of the semiconductor film, $C_o$ is the dielectric film capacitance and $V_D$ is the drain voltage.

TABLE 1

| | WATER CONTACT ANGLE | CHARGE MOBILITY [CM²/VS] | THRESHOLD VOLTAGE | ON/OFF CURRENT RATIO |
|---|---|---|---|---|
| Comparative Example 1 | 55° | $1.5 \times 10^{-3}$ | +12 V | 64.4 |
| Example 1 | 68° | $5.1 \times 10^{-3}$ | +22 V | $2.5 \times 10^4$ |
| Example 2 | 76° | $9.1 \times 10^{-3}$ | +4 V | $2.1 \times 10^4$ |

Referring to Table 1, if the amount of the crosslinking agent increases, the degree of curing increases and the density of the hydroxyl group decreases. As such, the hydrophilic surface of the insulator becomes hydrophobic. In the OTFT according to example embodiments, if the degree of curing of the gate insulating layer increases, then the mobility increases six fold, the on/off current ratio increases and the threshold voltage is approximately 0 V, and.

As described above, example embodiments provide an organic insulator composition including a hydroxyl group-containing polymer and a dielectric film and an OTFT using the same. According to example embodiments, the organic insulator composition may be cured at temperatures lower than 130° C. The organic insulator composition according to example embodiments has is more chemically resistance. As such, the organic insulator composition may be used to form a thin film in a low-temperature wet process. As such, the organic insulator composition may be used in the fabrication of a flexible display device.

The composition according to example embodiments may impart increased electrical properties if used in the fabrication of an OTFT. If a curing process is performed, the organic insulator composition may prevent (or reduce) the formation of reaction by-products, increasing the electrical properties.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An organic insulator composition, comprising:
    a hydroxyl group-containing oligomer or hydroxyl group-containing polymer; and
    a crosslinking agent, the crosslinking agent being a compound having at least two vinyl ether groups,
    wherein the hydroxyl group-containing polymer is selected from a group consisting of polyvinylalcohol, poly(hydroxyphenylmaleimide-co-hydroxystyrene), polyhydroxyimide, poly(vinylalcohol-co-ethylene) and copolymers thereof.

2. The organic insulator composition as set forth in claim 1, wherein the crosslinking agent is selected from a group consisting of 2,2'-bis(4-(2-(vinyloxy)ethoxy)phenyl)propane (BPA-DEVE), 1,1,1-tris(4-(2-(vinyloxy)ethoxy)phenyl)ethane, 1,3,5-tris(2-(vinyloxy)ethoxy)benzene, poly(ethylene glycol)divinyl ether, 4,4'-bis-but-3-enyloxy-biphenyl, 1,5-bis-but-3-enyloxy-naphthalene and mixtures thereof.

3. A dielectric film, comprising a compound including the organic insulator composition according to claim 1, wherein the crosslinking agent has at least two vinyl ether groups and the hydroxyl group-containing oligomers or hydroxyl group-containing polymers are crosslinked using the crosslinking agent.

4. The dielectric film as set forth in claim 3, wherein the compound of the dielectric film is a compound represented by Formula (11):

FORMULA (11)

wherein X and Y are each independently a tetravalent aromatic or aliphatic organic group, and B is a divalent aromatic or aliphatic organic group.

5. An organic thin film transistor, comprising a gate electrode on a substrate; a gate insulating layer on the gate electrode; source and drain electrodes on the gate insulating layer; and an organic semiconductor layer contacting the gate insulating layer, wherein the gate insulating layer includes the dielectric film according to claim 4.

6. The dielectric film as set forth in claim 4, wherein X of Formula (11) is selected from a group consisting of and

Y of Formula (11) is selected from a group consisting of

7. An organic thin film transistor, comprising a gate electrode on a substrate; a gate insulating layer on the gate electrode; source and drain electrodes on the gate insulating layer; and an organic semiconductor layer contacting the gate insulating layer, wherein the gate insulating layer includes the dielectric film according to claim 6.

8. An organic insulator composition, comprising:
   a hydroxyl group-containing oligomer or hydroxyl group-containing polymer; and
   a crosslinking agent,
   wherein the hydroxyl group-containing oligomer or hydroxyl group-containing polymer is selected from a group consisting of oligomers or polymers represented by Formula (1) to (3) below:

FORMULA (1)

wherein X and Y are each independently a tetravalent aromatic or aliphatic organic group, Z is hydrogen or a crosslinkable monovalent organic group, and it is an integer from 10 to 1,000;

FORMULA (2)

wherein Z and Z' are each independently hydrogen, a hydroxyl group, or a phenol group, and it is an integer from 10 to 1,000; and

FORMULA (3)

wherein l, m, and n are each independently an integer from 0 to 1,000, in which l and m are not both 0.

9. The organic insulator composition as set forth in claim 8, wherein X of Formula (1) is selected from a group consisting of

10. The organic insulator composition as set forth in claim 8, wherein Y of Formula (1) is selected from a group consisting of and

11. The organic insulator composition as set forth in claim 8, wherein Z of Formula (1) is selected from a group consisting of hydrogen (H), 12. The organic insulator composition as set forth in claim 8, wherein the hydroxyl group-containing oligomer or hydroxyl group-containing polymer is selected from a group consisting of oligomers or polymers represented by Formulas (4) to (6) and (8) to (10) below:

FORMULA (4)

FORMULA (5)

FORMULA (6)

FORMULA (7)

FORMULA (8)

-continued
FORMULA (9)

wherein, in Formulas (4) to (6), (8) and (9), n is an integer from 10 to 1,000; and

FORMULA (10)

wherein x and y are each independently an integer from 10 to 1,000.

13. An organic insulator composition, comprising:
a hydroxyl group-containing oligomer or hydroxyl group-containing polymer; and
a crosslinking agent,
wherein the hydroxyl group-containing polymer is selected from a group consisting of polyvinylalcohol, poly(hydroxyphenylmaleimide-co-hydroxystyrene), polyhydroxyimide, poly(vinylalcohol-co-ethylene) and copolymers thereof, and
the crosslinking agent is used in an amount ranging from a minimum value of Equation (1) to a maximum value of Equation (2) based on an amount of the hydroxyl group-containing oligomer or hydroxyl group-containing polymer:

$$\left( \frac{M.W. \text{ of crosslinking agent}}{M.W. \text{ of repeating unit of base resin}} \times \frac{\text{number of } OH \text{ groups in repeating unit of base resin}}{\text{number of } vinylether \text{ groups in crosslinking agent}} \right) \times$$

$100 \times 0.1$ parts

EQUATION (1)

$$\left( \frac{M.W. \text{ of crosslinking agent}}{M.W. \text{ of repeating unit of base resin}} \times \frac{\text{number of } OH \text{ groups in repeating unit of base resin}}{\text{number of } vinylether \text{ groups in crosslinking agent}} \right) \times$$

120 parts.

EQUATION (2)

* * * * *